$f_2$ to $f_Q$) are subject to multiple similarity calculation by means of multiple similarity calculation circuits 41-1, 41-2, ..., 41-Q, respectively. The obtained calculation results are subsequently supplied to a weighted-sum circuit 52. It should be noted that the respective partial multiple similarity calculations can be performed by such a known conventional method as described in U.S. Pat. No. 3,688,267.

As described above, the features of the input pattern are expressed by incorporating a matrix, and the multiple similarity calculation is performed between each feature vector and the corresponding reference pattern. For example, in a modified pattern whose elements are displaced in the same direction as shown in FIG. 8A as well as in a modified pattern whose elements are displaced in different directions as shown in FIG. 8B, the corresponding pattern features are properly extracted to match with the reference patterns of the respective categories, thereby obtaining proper similarities. Therefore, unlike in conventional character recognition, similar Kanji patterns such as is shown in FIG. 13 can be highly recognized. Furthermore, only the pattern elements are used to perform character recognition. For example, a hand-written character can be properly recognized.

The geometric features (such as line segment direction, end, intersection, etc.) of the character pattern may not always be extracted. Therefore, according to the present invention, it is very effective to use the feature data masked in accordance with mask data obtained from hermite's polynomials weighted by the Gaussian function.

Blurring is often used as an effective means for performing proper similarity calculation. For this purpose, an arrangement shown in FIG. 9 is used. The feature vector data of the input pattern expressed in a matrix form is supplied to the multiple similarity calculation unit 35 through a blurring unit 38. This blurring operation can be realized by using a mask pattern of the Gaussian function G(x) as shown in FIG. 2 and is described in U.S. patent application Ser. No. 366,667, for example. Furthermore, it is possible to reverse the data of the matrix rows and columns. In addition to the above modifications, it is possible to perform coefficient addition as the method of convolution as follows:

$$h_{m,n}(r, \tau, \tau') = \int\int f_{m,n}(r', \tau) \cdot G(r-r', \tau') dr'$$

(where, $G(r) = G(x)G(y)$).

When the mask patterns of the single system of coordinates shown in FIG. 3A to 3D are used, the short line segment pattern shown in FIG. 10A cannot be distinguished from that shown in FIG. 10B. These features are extracted to coincide with each other. In order to solve this problem, a second system of coordinates X'-Y' is used. This system of coordinates is obtained by rotating the first system of coordinates (FIG. 2) through an angle of 45°. The convolution operations along the X'- and Y'-axes shown in FIG. 10A are the same as those along the Y'- and X'-axes shown in FIG. 10B, respectively.

As shown in FIG. 11, when the two systems of coordinates X-Y and X'-Y' cross each other at an angle of 45° or 135°, a maximum characteristic extraction sensitivity is obtained. However, the two systems of coordinates need not cross at the above angle.

FIGS. 12B and 12D are mask patterns in the system of coordinates X'-Y' in the same manner as in the case of the mask patterns in FIGS. 12A and 12C corresponding to X-Y system which are used to extract the same feature as FIGS. 3D and 3C. When convolution is performed by the sum-of-product circuit 13 using the mask patterns in the system of coordinates X'-Y' in addition to the mask patterns stored in the mask memories 15-1, ..., and 15-Q shown in FIG. 1, pattern characteristic data which allows highly precise pattern recognition can be obtained.

What is claimed is:

1. A pattern features extracting apparatus comprising:
    a plurality of mask memories for storing a plurality of different mask pattern data whose values are obtained from Hermite's polynomials weighted by a Gaussian function;
    an input pattern memory for storing unknown input pattern data;
    means for accessing data in a predetermined area of said input pattern memory including a given position of the unknown input pattern; and
    means for convolving the data accessed corresponding to the unknown input pattern data using the plurality of different mask pattern data in said plurality of mask memories.

2. An apparatus according to claim 1, wherein the mask pattern data stored in each of said plurality of mask memories are obtained from Hermite's polynomials of different degrees weighted by the Gaussian function.

3. An apparatus according to claim 1, wherein the plurality of different mask pattern data include a first group of mask pattern data plotted in a first system of coordinates and a second group of mask pattern data plotted in a second system of coordinates which is rotated with respect to said first system through a predetermined angle.

4. An apparatus according to any one of claims 1 to 3, wherein said convolving means includes multiplying means for multiplying the unknown input pattern data read out from said input pattern memory with the mask pattern data read out from a given mask memory among said plurality of mask memories; adding means for receiving output data from said multiplying means; an accumulator for storing output data from said adding means; and means for supplying output data from said accumulator together with the output data from said multiplying means to said adding means.

5. An apparatus according to claim 1, wherein said convolving means produces output data which is then stored in a buffer memory in a matrix form, so as to correspond to feature data and position data of a given position of the unknown input pattern, one of the feature and position data being defined as row data, and the other thereof being defined as column data.

6. A Pattern recognition system comprising:
    a plurality of mask memories for storing a plurality of different mask pattern data whose values are obtained from Hermite's polynomials weighted by a Gaussian function;
    an input means for inputting unknown input pattern data;
    means for convolving the mask pattern data and unknown input pattern data;
    means for storing output data from said convolving means in a matrix form;
    means for calculating a multiple similarity for each output data stored in said matrix storing means; and
    means for recognizing the unknown input pattern in accordance with the multiple similarity.

United States Patent [19]

Defeuilly et al.

[11] Patent Number: 4,543,661
[45] Date of Patent: Sep. 24, 1985

[54] FREQUENCY SYNTHESIZER FOR A TRANSMITTER-RECEIVER

[75] Inventors: Jean P. Defeuilly, Cressely; Jean Nguyen-Van-Nguyen, Gif-sur-Yvette, both of France

[73] Assignee: U.S. Philips Corporation, New York, N.Y.

[21] Appl. No.: 611,058

[22] Filed: May 16, 1984

Related U.S. Application Data

[63] Continuation of Ser. No. 419,096, Sep. 16, 1982, abandoned.

[30] Foreign Application Priority Data

Sep. 23, 1981 [NL] Netherlands .................. 8117916

[51] Int. Cl.$^4$ ............................................ H04B 1/40
[52] U.S. Cl. ........................................ 455/76; 455/158; 455/183; 455/185; 331/1 A
[58] Field of Search .................... 455/76, 77, 84, 183, 455/185, 186, 158, 180; 331/1 A, 2, 18, 25, 49

[56] References Cited

U.S. PATENT DOCUMENTS

| | | | |
|---|---|---|---|
| 4,156,196 | 5/1979 | Someno et al. | 455/76 |
| 4,186,342 | 1/1980 | Kyle | 455/76 |
| 4,218,773 | 8/1980 | Imamura | 455/186 |
| 4,236,251 | 11/1980 | Ohgishi et al. | 455/183 |

FOREIGN PATENT DOCUMENTS 2513458  3/1983  France .................. 455/76

*Primary Examiner*—Jin F. Ng
*Attorney, Agent, or Firm*—Joseph P. Abate

[57] ABSTRACT

A frequency synthesizer for a transmitter-receiver includes a variable frequency divider which is programmed by coded information supplied by a display device through a code conversion circuit constituted by memories, the contents of said memories not utilized for programming the divider being utilized for programming the control information which permits, through suitable decoder circuits, the direct control of the devices producing the different functions of the transmitter-receiver.

1 Claim, 3 Drawing Figures

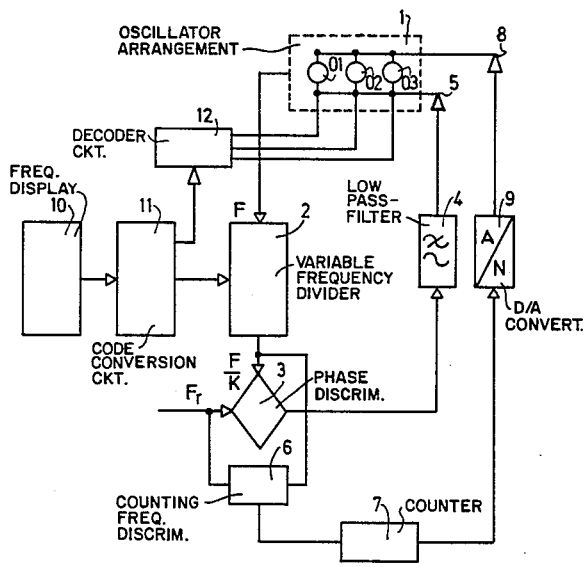

FREQUENCY SYNTHESIZER FOR A TRANSMITTER-RECEIVER

This is a continuation of application Ser. No. 419,096, filed Sept. 16, 1982 now abandoned.

The invention relates to an arrangement for managing the frequency control information of a transmitter-receiver station with a frequency synthesizer, the phase-locked loop of the synthesizer comprising, inter alia, an oscillator arrangement comprising several controllabe oscillators and a variable frequency divider which receives, in the form of a digital code, the information of the displayed frequency supplied in the form of another digital code by a frequency display device through a code conversion circuit constituted by memories, the variable frequency divider comprising the so-called division chain mainly composed of a first programmable counter associated with a first and a second memory of the code conversion circuit and of a divide-by-10 or divide-by-11 circuit controlled either by a second or by a third programmable counter, the second and third programmable counters being associated with a third and a fourth memory, respectively, of the code conversion circuit.

In a transmitter-receiver station, the reception and transmission frequencies (which may be different) are determined by the frequency synthesizer in the case of a multi-channel device and by the automatic tuning devices, mainly those of the receiver.

The management of the control information of the synthesizer and of the tuning devices requires that the information emitted by the control members at the disposal of the operator is handled so that their action results in that only the required functions are obtained.

According to the prior art, the frequency control device at the disposal of the operator controls both the frequency synthesizer and a combinative logic circuit.

The frequency synthesizer produces the pilot signals of transmission in the transmitter mode and of the local oscillator in the receiver mode at the frequencies determined by the frequency display and by the transmitter-receiver information (in an alternating manner).

The combinative logic circuit handles the control information of the other members of the transmitter-receiver station.

This mode of control, by a combinative logic circuit, is complex and results in an increase of the bulk and the cost-price of the transmitter-receiver assembly.

SUMMARY OF THE INVENTION

The invention has for its object to provide a simpler arrangement for handling said control information, characterized in that the contents of said memories not utilized for programming said counters are also utilized for programming the control information, by means of which a direct control through suitable decoder circuits of the devices can be obtained which produce the different functions of the transmitter-receiver station, especially the selection of the filters corresponding to the sub-frequency ranges of the receiver, the selection of said controllable oscillators and the handling of the information of prohibited frequencies.

The following description with reference to the accompanying drawings, given by way of example, permits of understanding more clearly how the invention can be realized.

DESCRIPTION OF THE PREFERRED EMBODIMENTS

Figure 1:
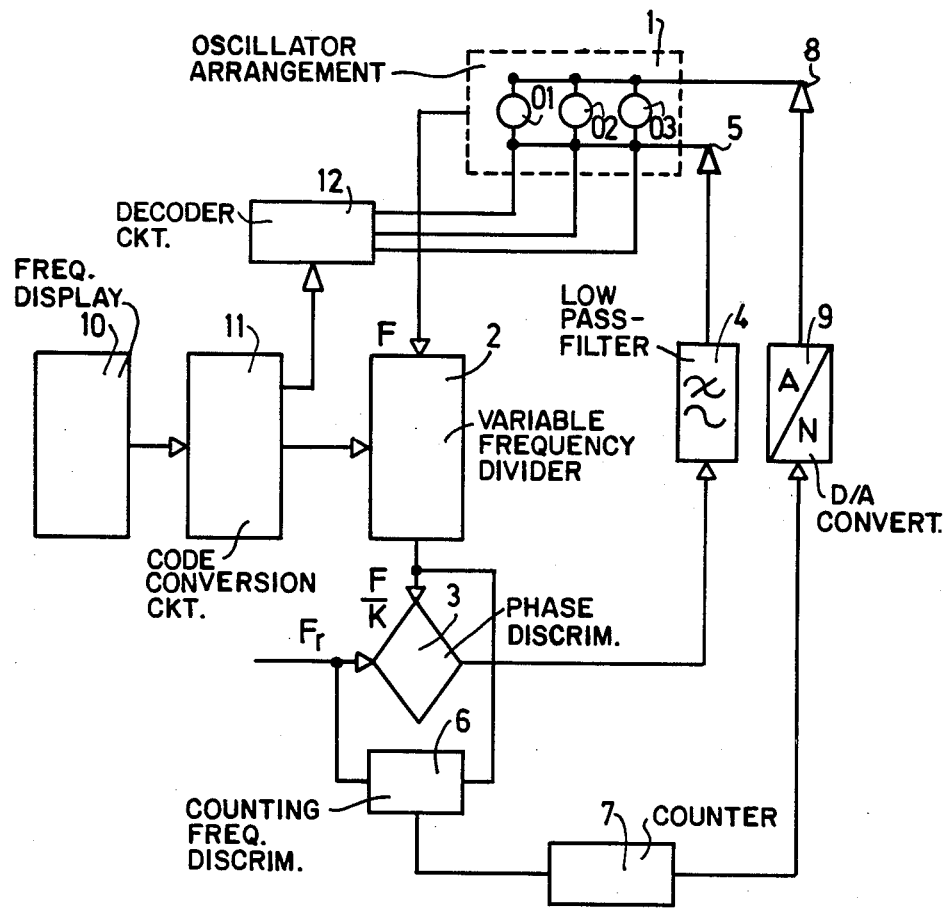
FIG. 1 shows the principal circuit diagram of the frequency synthesizer in which memories are utilized for conversion between the display code and the control of the programmable counters.

FIG. 1 shows the principal circuit diagram of the frequency synthesizer with so-called indirect synthesis with digital control, the phase-locked loop of which comprises the oscillator arrangement 1 comprising several controllable oscillators (for explanation of the operation, there are assumed to be three oscillators 01, 02 and 03), one of which after selection supplies the output frequency F, a variable frequency divider 2 dividing the frequency F by K, a phase discriminator 3 which receives a reference frequency $F_r$ and the divided frequency $F/K$, a low-pass filter 4 which supplies a frequency control voltage to an input 5 of the selected oscillator. The presence of the filter 4 limits the synchronization surface of the oscillator to a small frequency distance $\Delta F$ at which the difference $|F_r - F/K|$ must be smaller so that the loop is switched into circuit. The loop is switched into circuit more rapidly due to the presence of a hunting circuit for pre-adjusting the free frequency of the oscillator to a value near the desired output frequency F. This pre-adjustment takes place by means of a counting frequency discriminator 6 which supplies pulses when the distance between $F_r$ and $F/K$ is large. These pulses are applied to a counter 7 the content of which is converted into a direct voltage applied to an input 8 of the selected oscillator by means of the digital-to-analogue converter 9. This voltage is abruptly neutralized each time when the counter 7 is automatically reset to its initial position after having reached its final position. When the difference $|F_r - F/K|$ becomes smaller than the frequency distance $\Delta F$, the frequency discriminator 6 no longer supplies pulses, the counter 7 no longer advances and the voltage at 8 remains constant, which has the effect that the phase-locked loop is switched out of circuit.

The coded information (for example, according to BCD) supplied by the frequency display device 10 is applied to a code conversion circuit 11 constituted by memories supplying coded information (for example, according to a natural binary code) for controlling the variable frequency divider 2 with the division ratio K corresponding to the displayed frequency.

According to the invention, the coded information present in the memories of the code conversion circuit 11 are also utilized for programming the control information of the different functions of the transmitter-receiver station, inter alia the selection of the oscillators, a decoder circuit 12 transforming the programmed code into a 1-out-of-3 code which can be directly utilized to control said oscillators.

Figure 2:
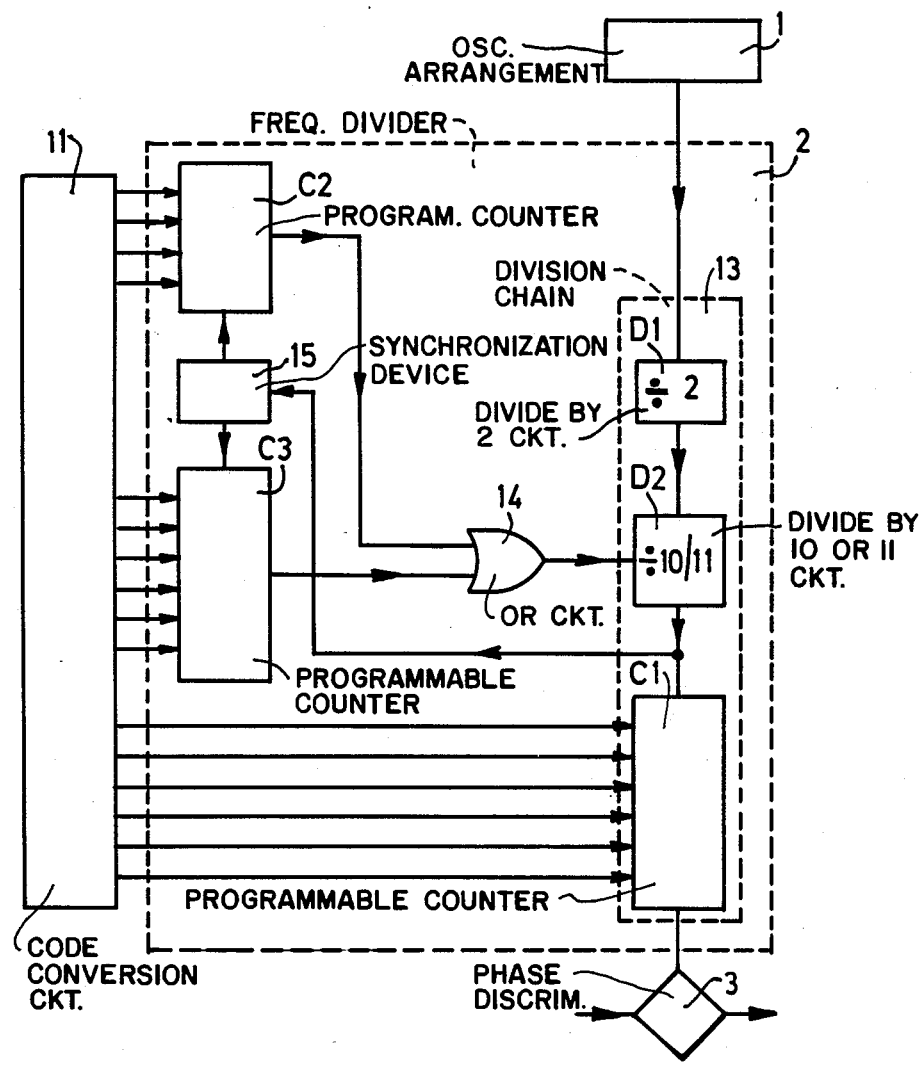
FIG. 2 shows the structure of the variable frequency divider.
Figure 3:
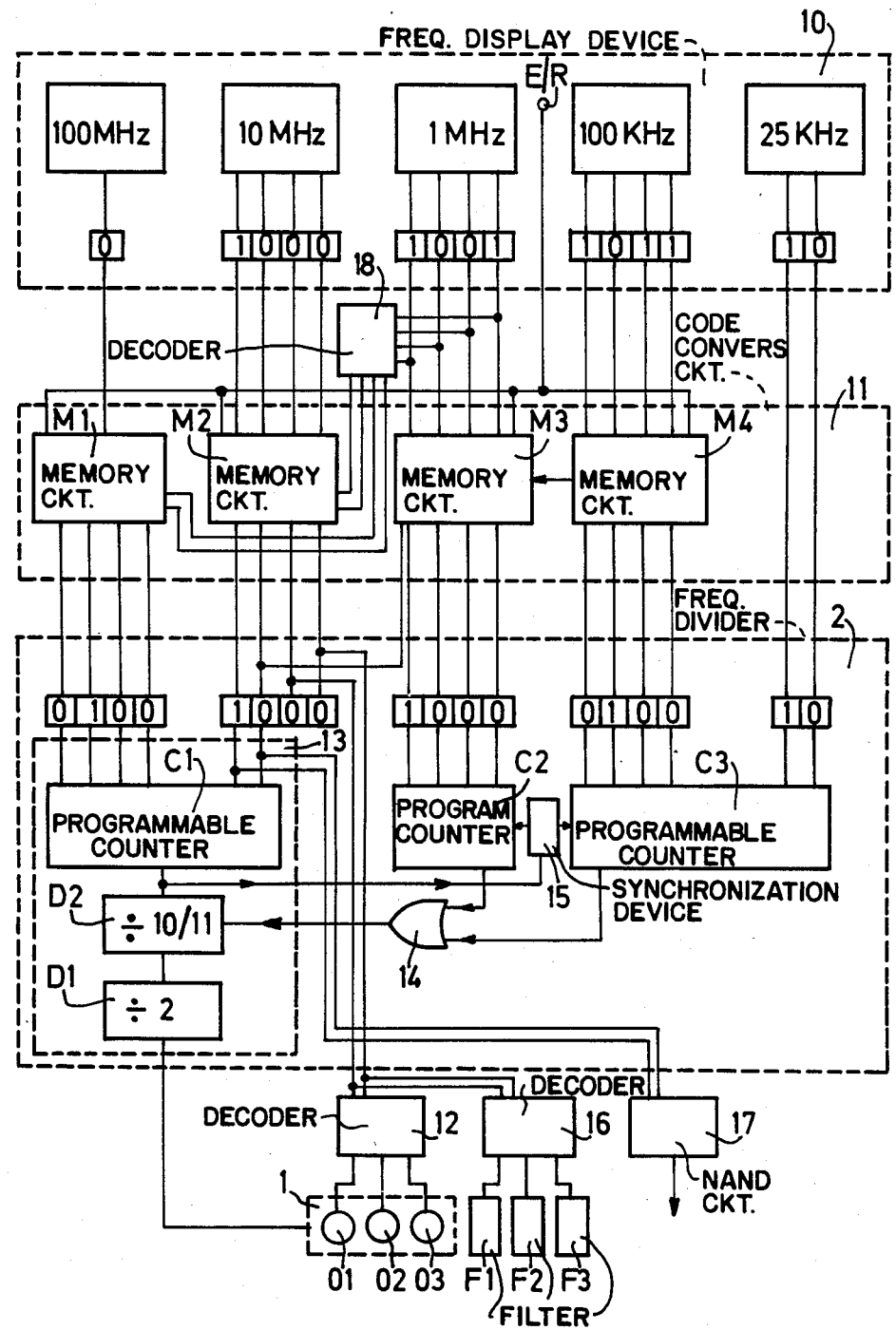
FIG. 3 shows an embodiment of the synthesizer for operation of the transmitter at the frequency of 276.250 MHz.

In order to understand the operation of these memories, it is necessary to describe, by means of an example, the operation of the variable frequency divider 2, the circuit diagram of which is shown in FIG. 2 and which serves to supply to the phase comparator 3 a constant